US012660299B2

(12) United States Patent
Shibib et al.

(10) Patent No.: US 12,660,299 B2
(45) Date of Patent: Jun. 16, 2026

(54) MOSFET DEVICE

(71) Applicant: Vishay Siliconix LLC, San Jose, CA (US)

(72) Inventors: Ayman Shibib, San Jose, CA (US); Misbah Azam, San Jose, CA (US); Jinman Yang, Santa Clara, CA (US)

(73) Assignee: Vishay Siliconix LLC, San Jose, CA (US)

( * ) Notice: Subject to any disclaimer, the term of this patent is extended or adjusted under 35 U.S.C. 154(b) by 0 days.

(21) Appl. No.: 18/866,425

(22) PCT Filed: May 17, 2022

(86) PCT No.: PCT/US2022/029604
§ 371 (c)(1),
(2) Date: Nov. 15, 2024

(87) PCT Pub. No.: WO2023/224603
PCT Pub. Date: Nov. 23, 2023

(65) Prior Publication Data
US 2025/0261438 A1 Aug. 14, 2025

(51) Int. Cl.
*H10D 30/00* (2025.01)
*H10D 8/00* (2025.01)
(Continued)

(52) U.S. Cl.
CPC ........... *H10D 84/101* (2025.01); *H10D 8/045* (2025.01); *H10D 8/411* (2025.01); *H10D 30/025* (2025.01);
(Continued)

(58) Field of Classification Search
CPC ...... H10D 84/101; H10D 8/045; H10D 8/411; H10D 30/025; H10D 30/63; H10D 62/103; H10D 62/124; H10D 62/60
See application file for complete search history.

(56) References Cited

U.S. PATENT DOCUMENTS 4,824,489 A 4/1989 Cogan et al.
4,832,761 A 5/1989 Geissberger et al.
(Continued)

FOREIGN PATENT DOCUMENTS

EP 0492991 A2 7/1992
EP 1648023 A1 4/2006
(Continued)

OTHER PUBLICATIONS

Notice of Allowance for corresponding Korean Application No. 10-2024-7041454 dated Jan. 24, 2025.
(Continued)

*Primary Examiner* — Samuel Park
(74) *Attorney, Agent, or Firm* — Volpe Koenig

(57) ABSTRACT

Semiconductor devices and methods, including metal oxide silicon field effect transistor (MOSFET) devices and methods. The semiconductor device, such as a MOSFET, includes two source regions; a drain region; two body regions, and a buffer region. Each of the two body regions contacts a different one of the two source regions. The buffer region is located between the two body regions, and contacts the two body regions. A doping concentration of the buffer region is less than a doping concentration of the two body regions.

17 Claims, 10 Drawing Sheets

(51) Int. Cl.

| | |
|---|---|
| *H10D 8/01* | (2025.01) |
| *H10D 30/01* | (2025.01) |
| *H10D 30/63* | (2025.01) |
| *H10D 62/10* | (2025.01) |
| *H10D 62/60* | (2025.01) |
| *H10D 84/00* | (2025.01) |

(52) U.S. Cl.
CPC ........... *H10D 30/63* (2025.01); *H10D 62/103* (2025.01); *H10D 62/124* (2025.01); *H10D 62/60* (2025.01)

(56) References Cited

U.S. PATENT DOCUMENTS

| | | | |
|---|---|---|---|
| 4,946,716 | A | 8/1990 | Corrie |
| 6,121,089 | A | 9/2000 | Zeng et al. |
| 6,263,566 | B1 | 7/2001 | Hembree et al. |
| 6,391,744 | B1 | 5/2002 | Hudak et al. |
| 6,492,195 | B2 | 12/2002 | Nakanishi et al. |
| 6,656,820 | B2 | 12/2003 | Liu |
| 6,713,366 | B2 | 3/2004 | Mong et al. |
| 6,861,723 | B2 | 3/2005 | Willmeroth |
| 7,547,578 | B2 | 6/2009 | Agarwal et al. |
| 7,728,402 | B2 | 6/2010 | Zhang et al. |
| 7,842,590 | B2 | 11/2010 | Gutt et al. |
| 7,932,185 | B2 | 4/2011 | Kudo et al. |
| 8,232,558 | B2 | 7/2012 | Zhang et al. |
| 8,330,244 | B2 | 12/2012 | Zhang et al. |
| 8,432,012 | B2 | 4/2013 | Zhang et al. |
| 8,653,534 | B2 | 2/2014 | Zhang et al. |
| 8,952,481 | B2 | 2/2015 | Zhang et al. |
| 9,318,624 | B2 | 4/2016 | Zhang |
| 9,349,596 | B2 | 5/2016 | Agarwal et al. |
| 9,831,355 | B2 | 11/2017 | Zhang |
| 9,859,383 | B2 | 1/2018 | Konrath et al. |
| 10,593,668 | B2 | 3/2020 | Siemieniec et al. |
| 10,950,699 | B2 | 3/2021 | Hu et al. |
| 11,189,702 | B2 | 11/2021 | Shibib et al. |
| 2002/0127821 | A1 | 9/2002 | Ohya et al. |
| 2002/0166625 | A1 | 11/2002 | Ball et al. |
| 2003/0020135 | A1 | 1/2003 | Kaminski et al. |
| 2003/0113984 | A1 | 6/2003 | Okada et al. |
| 2003/0134490 | A1 | 7/2003 | Inuzuka |
| 2006/0244006 | A1 | 11/2006 | Fujihira et al. |
| 2006/0255423 | A1 | 11/2006 | Ryu et al. |
| 2007/0228505 | A1 | 10/2007 | Mazzola et al. |
| 2008/0296771 | A1* | 12/2008 | Das ...................... H10D 62/393 |
| | | | 257/758 |
| 2009/0267200 | A1 | 10/2009 | Gutt et al. |
| 2012/0112276 | A1* | 5/2012 | Lee ......................... H10D 30/65 |
| | | | 257/E29.256 |
| 2012/0313112 | A1* | 12/2012 | Wada ................... H10D 62/405 |
| | | | 257/77 |
| 2015/0108501 | A1* | 4/2015 | Iwamuro .............. H10D 12/441 |
| | | | 257/77 |
| 2015/0162407 | A1 | 6/2015 | Laven et al. |
| 2016/0071949 | A1 | 3/2016 | Hiyoshi |
| 2016/0351657 | A1 | 12/2016 | Senoo |
| 2018/0047817 | A1 | 2/2018 | Ning |
| 2024/0030339 | A1 | 1/2024 | Shibib et al. |
| 2025/0107193 | A1* | 3/2025 | Atanackovic ...... H10D 62/8325 |
| 2025/0142925 | A1 | 5/2025 | Shibib et al. |

FOREIGN PATENT DOCUMENTS

| | | |
|---|---|---|
| EP | 3183753 B1 | 3/2025 |
| JP | S59-87872 A | 5/1984 |
| JP | H05145027 A | 6/1993 |
| JP | 2000252478 A | 9/2000 |
| JP | 2002314098 A | 10/2002 |
| JP | 2002314099 A | 10/2002 |
| JP | 2006186134 A | 7/2006 |
| JP | 3943749 B2 | 7/2007 |
| KR | 1020140067922 A | 6/2014 |
| WO | 01/86727 A2 | 11/2001 |
| WO | 01/86727 A3 | 11/2001 |
| WO | 2005048363 A2 | 5/2005 |

OTHER PUBLICATIONS

International Search Report and Written Opinion dated Aug. 29, 2022 for International Application No. PCT/US22/29604.

Zeng et al., "An Improved Power MOSFET Using A Novel Split Well Structure", IEEE, 1999, pp. 205-208.

Zeng et al., "Optimization of the Body-Diode of Power MOSFETs for High Efficiency Synchronous Rectification", ISPS0'2000, IEEE, pp. 145-148.

Supplementary Search Report for corresponding European Application No. 22942899.0 dated Dec. 17, 2025, 14 pages.

Office Action for corresponding Korean Application No. 10-2025-7013697 dated Dec. 24, 2025, 4 pages.

Office Action for corresponding Japanese Application No. 2024-568042 dated Apr. 16, 2026, 4 pages.

\* cited by examiner 500
502     502     502
260
218
250
210
204
FIG. 5
600
502     502     502
260
208     208
250
218
210
204
FIG. 6
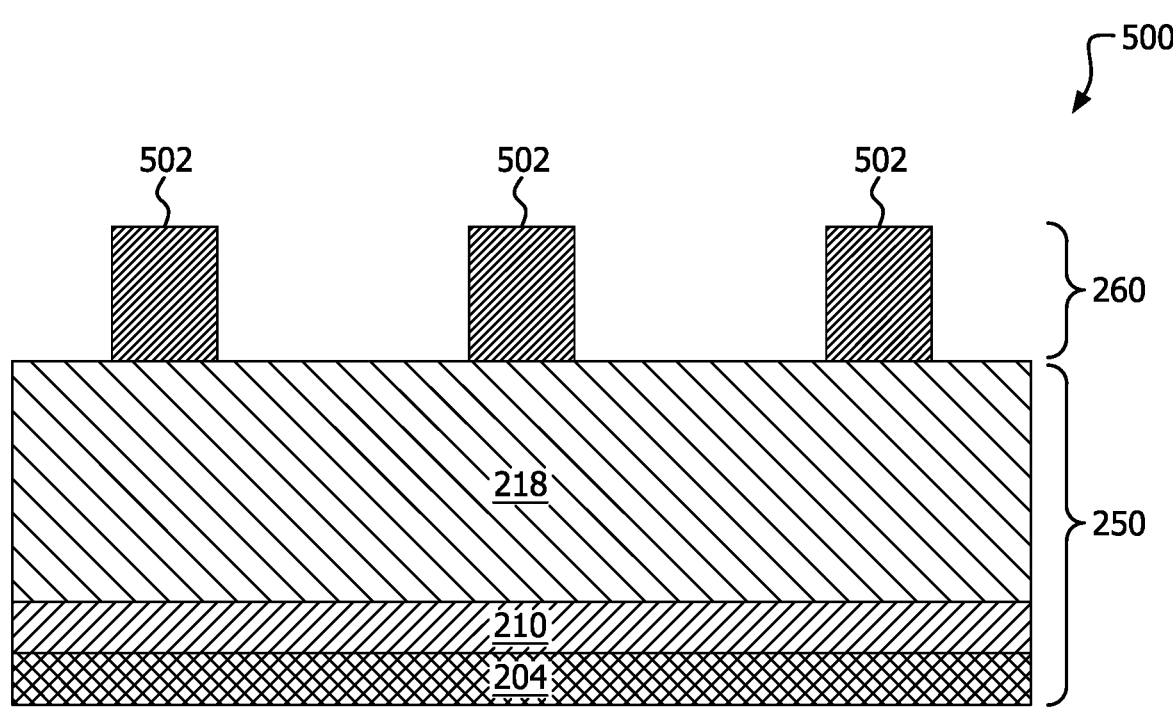
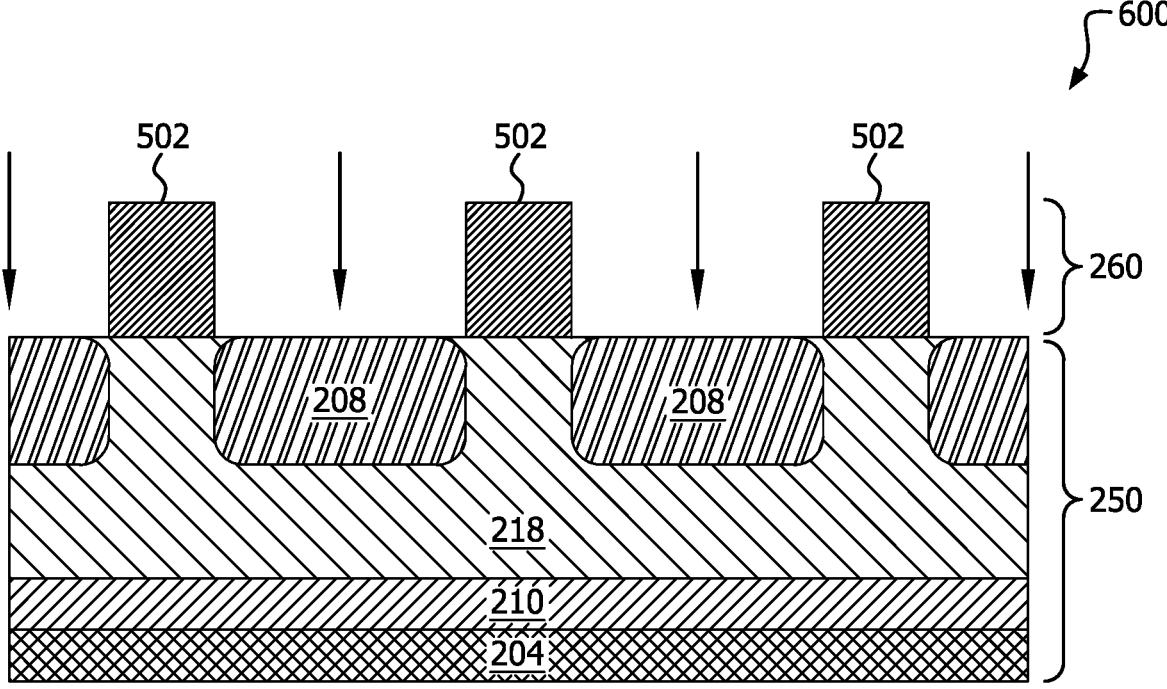

MOSFET DEVICE

RELATED APPLICATION DATA

The present application is a U.S. National Stage patent application under 35 U.S.C § 371 of International Application No. PCT/US2022/029604, filed on May 17, 2022, the entirety of which is incorporated by reference as if fully set forth herein.

FIELD OF THE INVENTION

The present disclosure relates to semiconductor devices, and is more particularly related to metal-oxide-semiconductor field-effect transistor (MOSFET) devices.

BACKGROUND

A MOSFET is a type of insulated-gate field-effect transistor which includes an intrinsic or parasitic body diode. MOSFET devices have a number of electrical characteristics or parameters. One example characteristic of a MOSFET is reverse recovery charge ($Q_{RR}$). The $Q_{RR}$ of a MOSFET is related to the switching speed of the MOSFET in typical motor drive applications or DC to DC converters. During the commutation of driving an inductor load, the MOSFET operates in the third quadrant where the source to drain P-N junction diode is turned on and charges are injected into the epitaxial layer. As the device is turned off, the injected charge needs to dissipate. Thus, having a large amount of reverse recovery charge ($Q_{RR}$) may slow the turning off of the device, reducing the efficiency due to power dissipation, or damaging the device if the drain voltage rises before the charges are removed.

BRIEF DESCRIPTION OF THE DRAWINGS

A more detailed understanding can be had from the following description, given by way of example in conjunction with the accompanying drawings wherein:

FIG. 5 is a cross-sectional view of an intermediate structure for manufacturing a power MOSFET;

FIG. 6 is another cross-sectional view of an intermediate structure for manufacturing a power MOSFET;

SUMMARY

Figure 1:
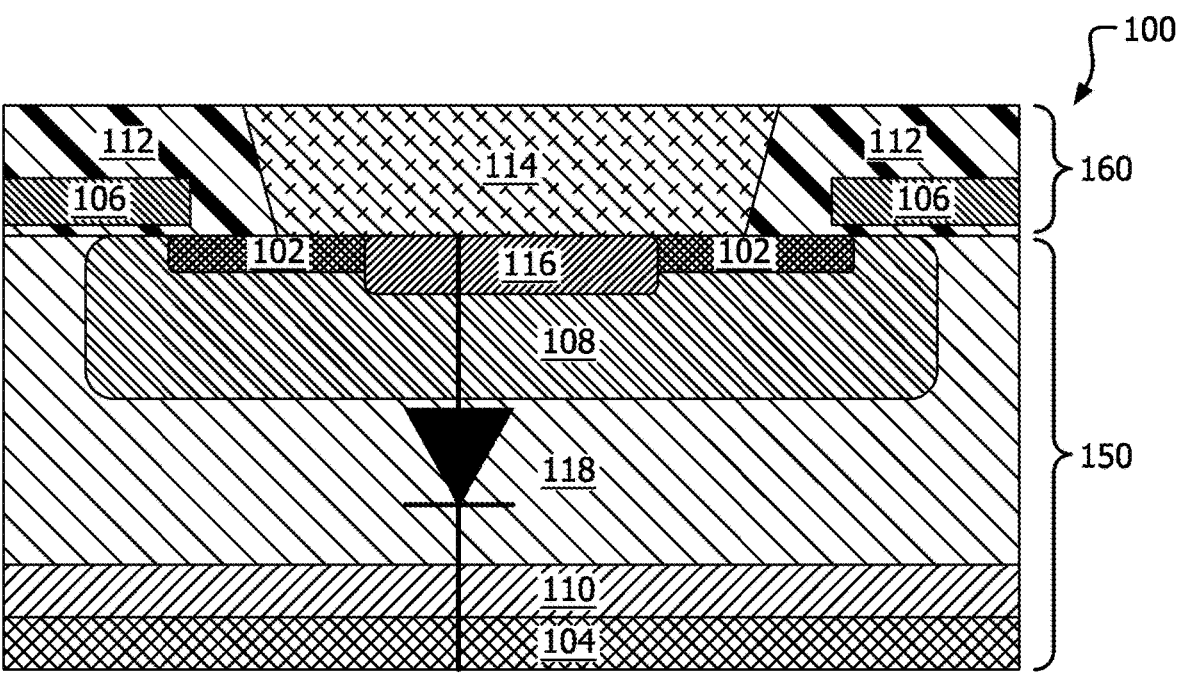
FIG. 1 is a cross-sectional view of an example power MOSFET.

Semiconductor devices and methods, including MOSFET devices and methods. The semiconductor device, such as a MOSFET, includes two source regions; a drain region; two body regions, and a buffer region. Each of the two body regions contacts a different one of the two source regions. The buffer region is located between the two body regions, and contacts the two body regions. A doping concentration of the buffer region is less than a doping concentration of the two body regions.

DETAILED DESCRIPTION

Some implementations provide a MOSFET. The MOSFET includes two source regions; a drain region; two body regions, and a buffer region. Each of the two body regions contacts a different one of the two source regions. The buffer region is located between the two body regions, and contacts the two body regions. A doping concentration of the buffer region is less than a doping concentration of the two body regions.

In some implementations, the buffer region extends further into an epitaxial layer than each of the two body regions. In some implementations, the two body regions include a p-type material, and the buffer region includes another p-type material that is less doped than the p-type material of the two body regions. In some implementations, a body diode of the MOSFET includes the buffer region. In some implementations, a body diode of the MOSFET includes a P-N junction between the buffer region and an epitaxial layer of the MOSFET. In some implementations, a P-N junction between the buffer region and an epitaxial layer of the MOSFET forms a depletion layer when the source regions and the drain region are reverse biased. In some implementations, a reverse recovery charge in a P-N junction between the buffer region and an epitaxial layer of the MOSFET recombines to form a depletion layer when the source regions and the drain region are reverse biased.

Some implementations provide a method for manufacturing a MOSFET. A doping material is implanted in a die between two body regions to form a buffer region located between the two body regions. The buffer region is less doped than the two body regions.

In some implementations, the buffer region extends further into an epitaxial layer than the two body regions. In some implementations, the two body regions include a p-type material, and the buffer region includes another p-type material that is less doped than the p-type material of two body regions. In some implementations, the buffer region includes a portion of a body diode of the MOSFET. In some implementations, the buffer region includes a portion of a body diode of a MOSFET that includes a P-N junction between the buffer region and an epitaxial layer of the MOSFET. In some implementations, a P-N junction between the buffer region and an epitaxial layer of the MOSFET forms a depletion layer when a source region and a drain region of the MOSFET are reverse biased. In some implementations, a reverse recovery charge in a P-N junction between the buffer region and an epitaxial layer of the MOSFET recombines to form a depletion layer when a source region and a drain region of the MOSFET are reverse biased.

Some implementations provide a semiconductor device. The semiconductor device includes a source and a drain. A diode of the semiconductor device, located between the source and the drain, includes buffer region located between two body regions. At least one of the two body regions contacts the source. The buffer region is less doped than the two body regions.

In some implementations, the buffer region extends further into an epitaxial layer than the two body regions. In some implementations, the body regions include p-type material doped to a first dopant concentration, and the buffer region includes p-type material doped to a second dopant concentration that is lower than the first dopant concentration. In some implementations, the diode includes an intrinsic diode of a MOSFET. In some implementations, the diode includes a P-N junction between the buffer region and an epitaxial region. In some implementations, a P-N junction between the buffer region and an epitaxial region forms a depletion layer when the source and the drain are reverse biased.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Certain terminology is used in the following description for convenience only and is not limiting. The words "right," "left," "top," and "bottom" designate directions in the drawings to which reference is made. The words "a" and "one," as used in the claims and in the corresponding portions of the specification, are defined as including one or more of the referenced item unless specifically stated otherwise. This terminology includes the words above specifically mentioned, derivatives thereof, and words of similar import. The phrase "at least one" followed by a list of two or more items, such as "A, B, or C," means any individual one of A, B or C as well as any combination thereof. It may be noted that some figures are shown with partial transparency for the purpose of explanation, illustration and demonstration purposes only, and is not intended to indicate that an element itself would be transparent in its final manufactured form.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region, substrate, lead, clip, pad, or contact is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer, region. It will be understood that these terms are intended to encompass different orientations of the device in addition to the orientation depicted in the figures.

The figures are not drawn to scale, and only portions of the structures, as well as the various layers that form those structures, may be shown in the figures. The figures, in general, illustrate symbolic and simplified structures to convey understanding of the invention, and are not intended to reproduce physical structures in detail. Furthermore, fabrication processes and operations may be performed along with the processes and operations discussed herein; that is, there may be a number of process operations before, in between and/or after the operations shown and described herein. Further, embodiments in accordance with the present invention can be implemented in conjunction with these other (perhaps conventional) processes and operations without significantly perturbing them. Generally, embodiments in accordance with the present invention may replace and/or supplement portions of a conventional process without significantly affecting peripheral processes and operations.

The term "MOSFET" is generally understood to be synonymous with the term insulated-gate field-effect transistor (IGFET), as many modern MOSFETs comprise a non-metal gate and/or a non-oxide gate insulator. As used herein, the term "MOSFET" does not necessarily imply or require FETs that include metal gates and/or oxide gate insulators. Rather, the term "MOSFET" includes devices commonly known as or referred to as MOSFETs.

The term "substantially" in the description and claims of the present application is used to refer to design intent, rather than a physical result. The semiconductor arts have deployed an ability to measure numerous aspects of a semiconductor to a high degree of accuracy. Accordingly, when measured to available precision, in general, no physical aspect of a semiconductor is precisely as designed. Further, measurement technology may readily identify differences in structures that are intended to be identical. Accordingly, terms such as "substantially equal" should be interpreted as designed to be equal, subject to manufacturing variation and measurement precision.

FIG. 1 is a cross-sectional view of an example power MOSFET 100. MOSFET 100 is shown as an n-channel enhancement mode MOSFET. It is noted that the examples herein are described with respect to n-channel enhancement mode MOSFETs for exemplary purposes, however the techniques described herein are also applicable to p-channel devices. For example, a p-channel device may have the opposite type of dopants than in the n-channel device case. In some implementations, a p-channel device would have the same regions and the same doping concentrations as described in the examples herein, but with the dopant types reversed (e.g., P– region instead of N– region, N+ region instead of P+ region, and so forth). The techniques described herein are also applicable to depletion mode devices where a gate voltage is applied to turn off the power MOSFET.

MOSFET 100 is formed in a wafer 150 by implanting and/or diffusing materials, such as dopants, within wafer 150, and by depositing materials, such as metal and polysilicon, in a region 160 on a top surface of wafer 150. Wafer 150 is a semiconductor wafer made from any suitable material, such as silicon, silicon carbide, germanium, gallium nitride and other semiconductors.

MOSFET 100 includes source regions 102, drain region 104, gate regions 106, and body region 108. Source regions 102 are n-doped regions in wafer 150 within body region 108. Source regions 102 are typically heavily doped as compared with other n-type regions in MOSFET 100, such as drain region 104. For example, in some implementations, a heavily doped region has a concentration of dopants in the range of $1\times10^{18}$-$5\times10^{20}$ atoms/cm3. Drain region 104 is usually a heavily n-doped substrate n-doped region for making a low resistance current path in wafer 150 on a side opposite region 160. N– region 110 is a n-type material deposited on the substrate 104 acting as intermediate layer with slightly less doping (e.g., less by 30%, or up to a factor of 3 less) than the substrate but much higher doping (e.g., higher by at least an order of magnitude) than region 118 in wafer 150 between drain region 104 and n-epitaxial region 118, Typical doping ranges could be from near intrinsic about $1\times10^{11}$/cm$^3$ up to about $1\times10^{17}$/cm$^3$, depending on the required maximum voltage that the device should handle. N– region 110 acts as a barrier to prevent defects from the drain region 104 getting into region 118 and also to prevent out-diffusion from drain region 104 into n-epitaxial region 118.

Gate regions 106 are polysilicon material regions within the oxide regions 112 disposed on the surface of wafer 150 in region 160. Body region 108 is a well of p-type material. It is noted that polysilicon is exemplary. For example, in some implementations, the gate regions may be implemented using metallic materials, such as tungsten silicide or aluminum. The body region 108 is typically higher in doping concentration by several factors than the doping level in the epitaxial layer 118; e.g., up to an order of magnitude or more within wafer 150. Source metal 114 may comprise any suitable conductive material (e.g., aluminum or copper, gold, or alloys thereof) and is disposed between oxide regions 112 in region 160 on the surface of wafer 150. Source metal 114 forms a contact for source regions 102 and also shorts source regions 102 with a p+ region 116 disposed within body region 108, between source regions 102. P+ region 116 is a region of p-type material disposed within wafer 150 between source regions 102. P+ region 116 is relatively more heavily doped than body region 108.

Body region 108 and n-epitaxy region 118 share a P-N junction, and form an intrinsic (also referred to as parasitic) body diode between source metal 114 and drain region 104, as indicated by a diode symbol in FIG. 1. In some implementations, P+ region 116 is relatively heavily doped to have a low contact resistance with the metal contact and in order to short the parasitic bipolar transistor's emitter (i.e., n+ source regions 102) to the p body 108.

Under conditions where source metal 114 and drain 104 are forward biased and gate 106 voltage is above a threshold voltage (i.e., the minimum gate voltage that will turn on the MOSFET for n-channel devices), n-channels form within body 108 beneath gate regions 106, and current flows between source regions 102 and drain region 104 via inversion layers within body 108 and via an n-epitaxy layer 118.

Under conditions where the voltage across source regions 102 and drain 104 switches from the forward biased state to a reverse biased state with a voltage exceeding a reverse breakdown voltage of the P-N junction between body region 108 and n-epitaxy region 118, a reverse recovery current ($I_{RR}$) flows from drain 104 to source contact 114 across the P-N junction between body region 108 and n-epitaxy region 118 until charge carriers stored in the P-N junction recombine and a depletion region forms at the P-N junction, blocking the reverse recovery current (or blocking the majority of the current). The amount of charge which recombines to block the reverse recovery current (or block the majority of the current) is referred to as the reverse recovery charge ($Q_{RR}$) and the time required to block the reverse recovery current (or block the majority of the current) is referred to as the reverse recovery time ($t_{RR}$).

In some implementations, it is desired to minimize, optimize, or reduce the reverse recovery charge ($Q_{RR}$) and/or reverse recovery time ($t_{RR}$) in a power MOSFET.

Figure 2:
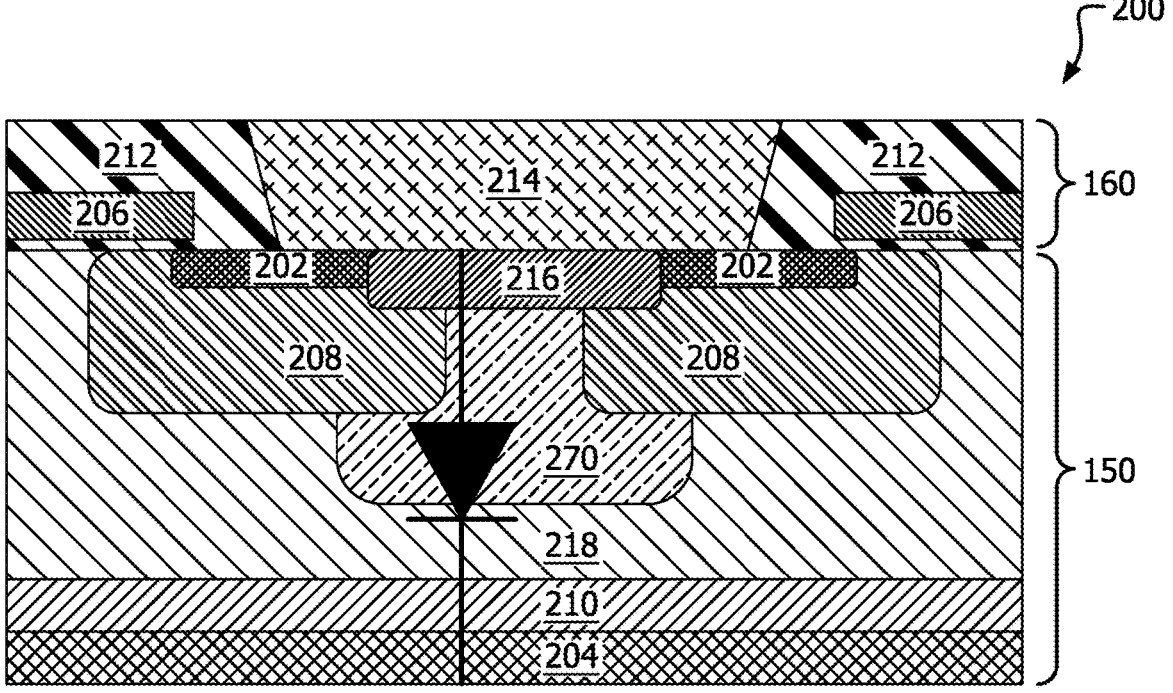
FIG. 2 is a cross-sectional view of another example power MOSFET.

FIG. 2 is a cross-sectional view of an example power MOSFET 200. MOSFET 200 is shown as an n-channel enhancement mode MOSFET, and is substantially similar to MOSFET 100 as shown and described with respect to FIG. 1, except in that it includes a buffer region 270, and body region 208 is divided as shown. MOSFET 200 is formed in a wafer 250 by implanting and/or diffusing materials, such as dopants, within wafer 250, and by depositing materials, such as metal and polysilicon, in a region 260 on a top surface of wafer 250. Wafer 150 is a semiconductor wafer made from any suitable material, such as silicon or silicon carbide.

MOSFET 200 includes source regions 202, drain region 204, gate regions 206, and body regions 208. Source regions 202 are n-doped regions in wafer 250 within body regions 208. Source regions 202 are typically heavily doped as compared with other n-type regions in MOSFET 200, such as drain region 204. Drain region 204 is an n-doped region implanted in wafer 250 on a side opposite region 260. N– region 210 is a n-type region in wafer 250 between drain region 204 and n-epitaxial region 218. N– region 210 is more lightly doped than drain region 204.

Gate regions 206 are polysilicon material regions within the oxide regions 212 disposed on the surface of wafer 250 in region 260. Body regions 208 are wells of p type material within wafer 250. Source metal 214 is disposed between oxide regions 212 in region 260 on the surface of wafer 250. Source metal 214 forms a contact for source regions 202 and also shorts source regions 202 with a p+ region 216 disposed between body regions 208, and between source regions 202. P+ region 216 is a region of p-type material disposed within wafer 250 between source regions 202. P+ region 216 is relatively more heavily doped than body regions 208.

Buffer region 270 is a region of p– material implanted between body regions 208, and between p+ region 216 and n-epitaxy region 218. The p type material of buffer region

270 is more lightly doped than p+ region 216, forming a high-low junction between p+ region 216 and buffer region 270. The p type material of buffer region 270 is also more lightly doped than body regions 208. Buffer region 270 and n-epitaxy region 218 share a P-N junction, and form a part of an intrinsic (also referred to as parasitic) body diode between source metal 214 and drain region 204, as indicated by a diode symbol in FIG. 2.

Buffer region 270 prevents or inhibits the excessive injection of charge (holes, in this case) of p+ region 216 into the n-epitaxy region 218, creating the high-low junction between p+ region 216 and buffer region 270. The high-low junction has a low charge injection efficiency into n-epitaxy region 218. Further, the buffer region 270 prevents breakdown voltage from occurring prematurely; i.e., before body regions 208 block the pre-mature breakdown between P+ 216 and N-Epi 218.

Under conditions where source metal 214 and drain 204 are forward biased and gate 206 voltage is above a threshold, n-channels form in body 208 beneath gate regions 206, and current flows between source regions 202 and drain region 204 via inversion layers within body 208 and via an n-epitaxy layer 218.

Under conditions where the voltage across source regions 202 and drain 204 switches from the forward biased state to a reverse biased state with a voltage exceeding a reverse breakdown voltage of the P-N junction between buffer region 270 and n-epitaxy region 218, a reverse recovery current ($I_{RR}$) flows from drain 204 to source contact 214 across the P-N junction between buffer region 270 and n-epitaxy region 218 until charge carriers stored in the P-N junction recombine and a depletion region forms at the P-N junction, blocking the reverse recovery current (or blocking the majority of the current). The amount of charge which recombines to block the reverse recovery current (or block the majority of the current) is referred to as the reverse recovery charge ($Q_{RR}$) and the time required to block the reverse recovery current (or block the majority of the current) is referred to as the reverse recovery time ($t_{RR}$).

The characteristics of the P-N junction of the body diode of power MOSFET 200 differ from the characteristics of the P-N junction of the body diode of power MOSFET 100, shown and described with respect to FIG. 1, in that fewer charge carriers are available in buffer region 270 as opposed to body region 108. This has the effect of causing the intrinsic body diode of power MOSFET 200 to recombine the reverse recovery charge $Q_{RR}$ in less time than the intrinsic body diode of power MOSFET 100, and thus for the depletion region to form and block the majority of the reverse recovery current in less time than in power MOSFET 100.

In other words, because buffer region 270 is more lightly doped than body region 108 of power MOSFET 100, shown and described with respect to FIG. 1, the reverse recovery charge ($Q_{RR}$) is lower in power MOSFET 200. Accordingly, the reverse recovery time ($t_{RR}$) is also lower in power MOSFET 200. This can have the advantage of increasing the switching speed of power MOSFET 200.

Figure 3:
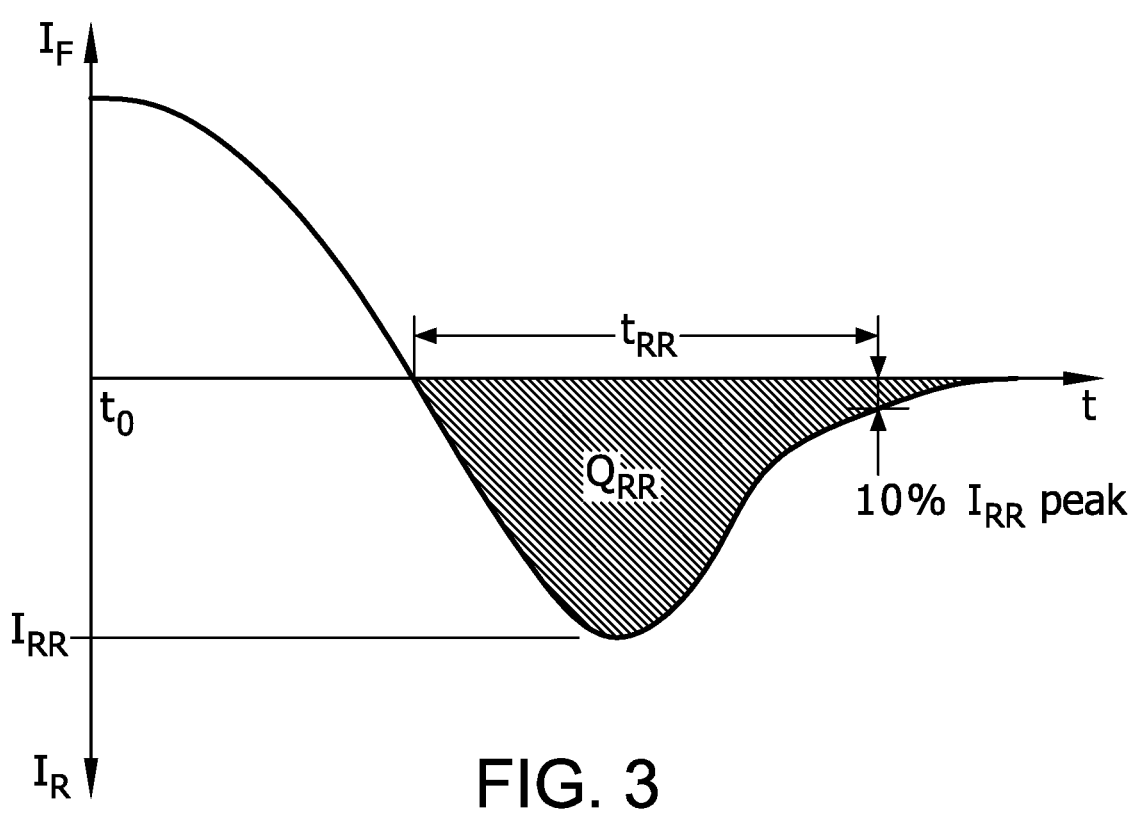
FIG. 3 is a line graph illustrating characteristics of an intrinsic body diode of the example power MOSFET of FIG. 1.

FIG. 3 is a line graph illustrating characteristics of the intrinsic body diode of example power MOSFET 100, shown and described with respect to FIG. 1. The line graph illustrates the function I(t) for the intrinsic body diode, i.e., the range of current through the intrinsic body diode in the time domain, for a period of time after the intrinsic body diode switches from a forward biased state to a reverse biased state.

At $t_0$, the intrinsic body diode is forward biased, and a forward current $I_F$ is passing through the body diode (i.e., from source 102 to drain 104) when the biasing of the intrinsic body diode of power MOSFET 100 is switched from forward biased to reverse biased. After to, the forward current $I_F$ through the intrinsic body diode of power MOSFET 100 begins to decrease until it reaches 0 Volts.

After the forward current $I_F$ reaches zero, reverse current $I_R$ begins to flow through the intrinsic body diode (i.e., from drain 104 to source 102), since the P-N junction of the intrinsic body diode remains conductive while charge carriers in the P-N junction of the intrinsic body diode begin to recombine to form a depletion region. As charge carriers recombine and the depletion region grows, $I_R$ decreases until it reaches a peak $I_R$, referred to as the reverse recovery current $I_{RR}$. After the reverse current $I_R$ peaks at the reverse recovery current $I_{RR}$, the reverse current $I_R$ decreases but continues to flow through the intrinsic body diode until the charge stored in the P-N junction has recombined to form the depletion region, and current flowing through the intrinsic body diode is 0 (or nearly zero, except for reverse leakage current). By convention, the time from when reverse recovery current begins to flow through the intrinsic body diode to the time when the reverse recovery current reaches 10% of the reverse recovery current $I_{RR}$, after having reached $I_{RR}$, is referred to as the reverse recovery time ($t_{RR}$).

In some implementations, the reverse recovery time ($t_{RR}$) is calculated based on a different percentage of the peak reverse recovery current $I_{RR}$, or another threshold. The amount of charge that recombines during formation of the depletion region during the reverse recovery time $t_{RR}$ is referred to as the reverse recovery charge, $Q_{RR}$.

Figure 4:
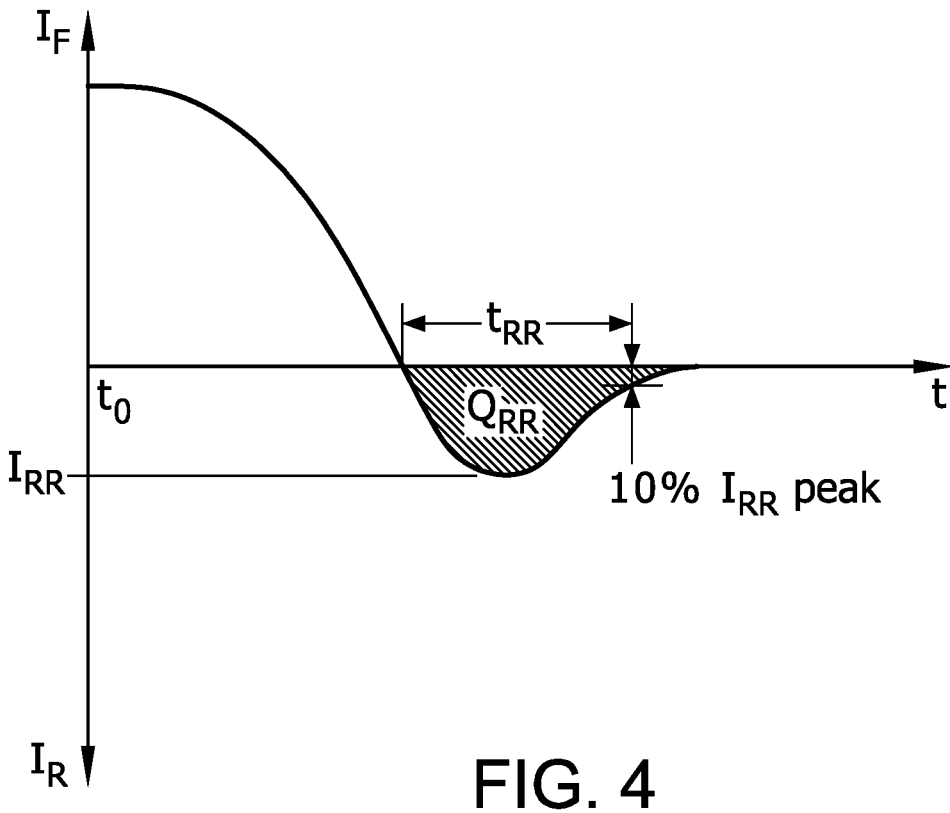
FIG. 4 is a line graph illustrating characteristics of an intrinsic body diode of the example power MOSFET of FIG. 2.

FIG. 4 is a line graph illustrating characteristics of the intrinsic body diode of example power MOSFET 200, shown and described with respect to FIG. 2. The line graph illustrates the function I(t) for the intrinsic body diode, i.e., the range of current through the intrinsic body diode in the time domain, for a period of time after the intrinsic body diode switches from a forward biased state to a reverse biased state.

At $t_0$, the intrinsic body diode is forward biased, and a forward current $I_F$ is passing through the body diode (i.e., from source 202 to drain 204) when the biasing of the intrinsic body diode of power MOSFET 200 is switched from forward biased to reverse biased. After to, the forward current $I_F$ through the intrinsic body diode of power MOSFET 200 begins to decrease until it reaches 0 Volts.

After the forward current $I_F$ reaches zero, reverse current $I_R$ begins to flow through the intrinsic body diode (i.e., from drain 204 to source 202), since the P-N junction of the intrinsic body diode remains conductive while charge carriers in the P-N junction of the intrinsic body diode begin to recombine to form a depletion region. As charge carriers recombine and the depletion region grows, $I_R$ decreases until it reaches the reverse recovery current $I_{RR}$. After the reverse current $I_R$ peaks at the reverse recovery current $I_{RR}$, the reverse current $I_R$ decreases but continues to flow through the intrinsic body diode until the charge stored in the P-N junction has recombined to form the depletion region, and current flowing through the intrinsic body diode is 0 (or nearly zero, except for reverse leakage current). By convention, the reverse recovery time ($t_{RR}$) is considered to be the time from when reverse recovery current begins to flow through the intrinsic body diode to the time when the reverse recovery current reaches 10% of the reverse recovery current $I_{RR}$, after having reached $I_{RR}$.

In some implementations, the reverse recovery time ($t_{RR}$) is calculated based on a different percentage of the peak reverse recovery current $I_{RR}$, or another threshold. The reverse recovery charge $Q_{RR}$ recombines during formation of the depletion region during the reverse recovery time $t_{RR}$.

Because the amount of reverse recovery charge ($Q_{RR}$) stored in the P-N junction of the intrinsic body diode of power MOSFET 200 is smaller than the amount of reverse recovery charge ($Q_{RR}$) stored in the P-N junction of the intrinsic body diode of power MOSFET 100 (as described above), these charge carriers recombine in less time, and thus the depletion layer forms, blocking the reverse current $I_R$, in less time than in power MOSFET 100. In some implementations this has the advantage of providing a shorter reverse recovery time ($t_{RR}$) than in power MOSFET 100. In some implementations, this has the advantage of providing a faster switching time.

FIG. 5 is a cross-sectional view of an intermediate structure 500 for manufacturing power MOSFET 200. Intermediate structure 500 includes wafer 250, drain region 204, n– region 210, and n-epitaxial region 218. A blocking material 502, such as a photoresist material or in a preferred embodiment, especially for silicon carbide, the 502 material is a thick layer of deposited oxide, which may be referred to as Hard Mask (HM), is deposited in a region 260 on a top surface of wafer 250. Blocking material 502 is disposed on the top surface of wafer 250, in region 260, in such a way as to selectively prevent diffusion of doping materials into wafer 250.

FIG. 6 is a cross-sectional view of an intermediate structure 600 for manufacturing power MOSFET 200. Intermediate structure 600 includes wafer 250, drain region 204, n– region 210, n-epitaxial region 218, and blocking material 502. P-type doping material is implanted into n-epitaxial region 218 via gaps in the blocking material 502 as indicated by arrows in FIG. 6. The implanted p-type doping material forms body regions 208 in intermediate structure 600 as shown. It is noted that other body regions are shown formed in wafer 250. Such regions form a part of other devices in the wafer, in some implementations. After body regions 208 are formed in intermediate structure 600, blocking material 502, in some implementations, if it is HM, it is not removed. If the blocking material 502 is photoresist, it may be removed by a suitable solvent.

Figure 7:
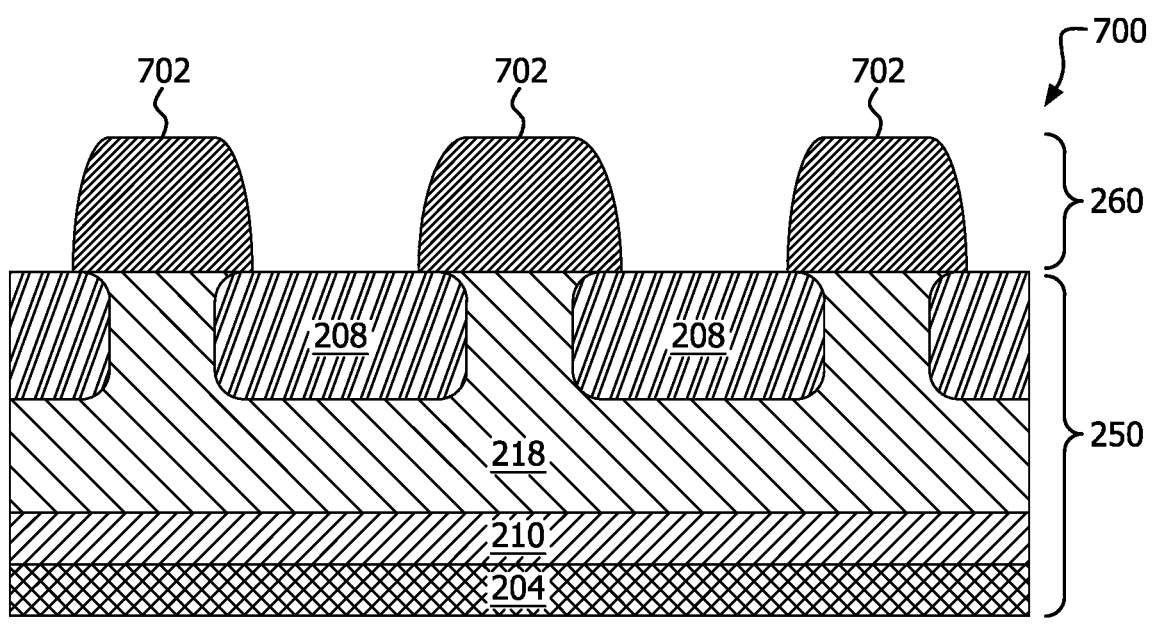
FIG. 7 is another cross-sectional view of an intermediate structure for manufacturing a power MOSFET.

FIG. 7 is a cross-sectional view of an intermediate structure 700 for manufacturing power MOSFET 200. Intermediate structure 700 includes wafer 250, drain region 204, n– region 210, n-epitaxial region 218, and body regions 208. An etch process is performed which leaves an oxide spacer (blocking material 702) with a specific footprint of a pre-specified dimension, forming a self-aligned channel region on a top surface of wafer 250. Blocking material 702 is disposed on the top surface of wafer 250, in region 260, in such a way as to selectively prevent diffusion of doping materials into wafer 250.

Figure 8:
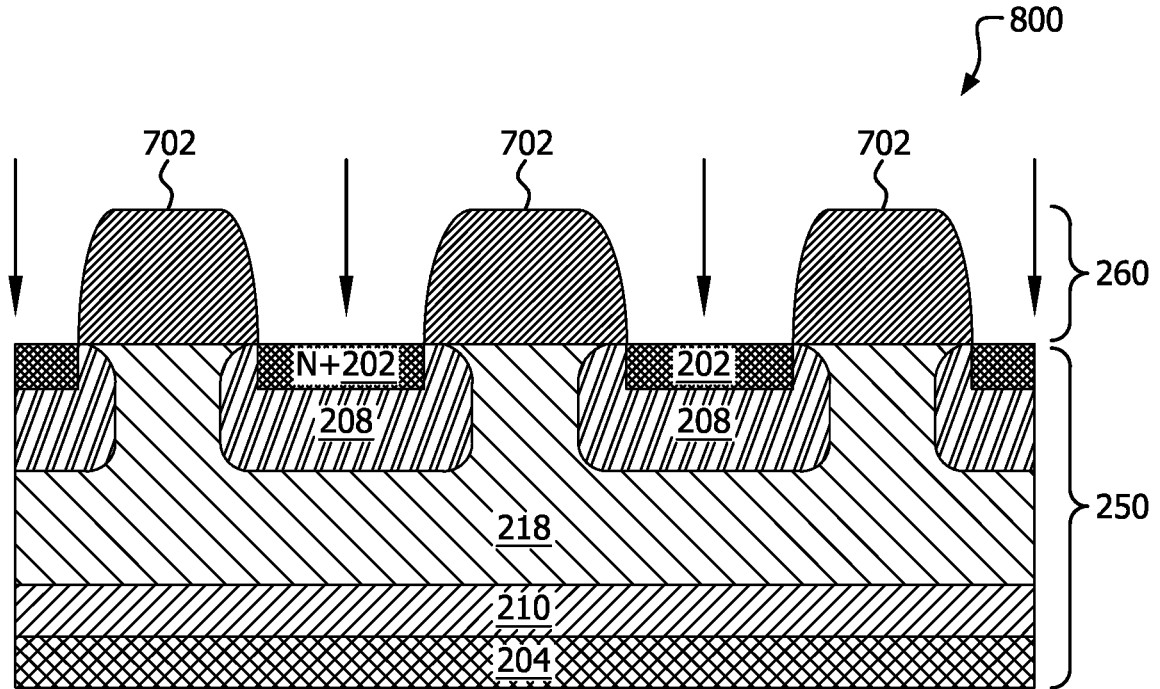
FIG. 8 is another cross-sectional view of an intermediate structure for manufacturing a power MOSFET.

FIG. 8 is a cross-sectional view of an intermediate structure 800 for manufacturing power MOSFET 200. Intermediate structure 800 includes wafer 250, drain region 204, n– region 210, n-epitaxial region 218, body regions 208, and blocking material 702. N-type doping material is implanted into body regions 208 via gaps in the blocking material 702 as indicated by arrows in FIG. 8. The implanted n-type doping material forms source regions 202 in intermediate structure 800 as shown. It is noted that other source regions are shown formed in wafer 250. Such regions form a part of other devices in the wafer, in some implementations. After source regions 202 are formed in intermediate structure 800, blocking material 702 is removed, e.g., by a suitable solvent.

Figure 9:
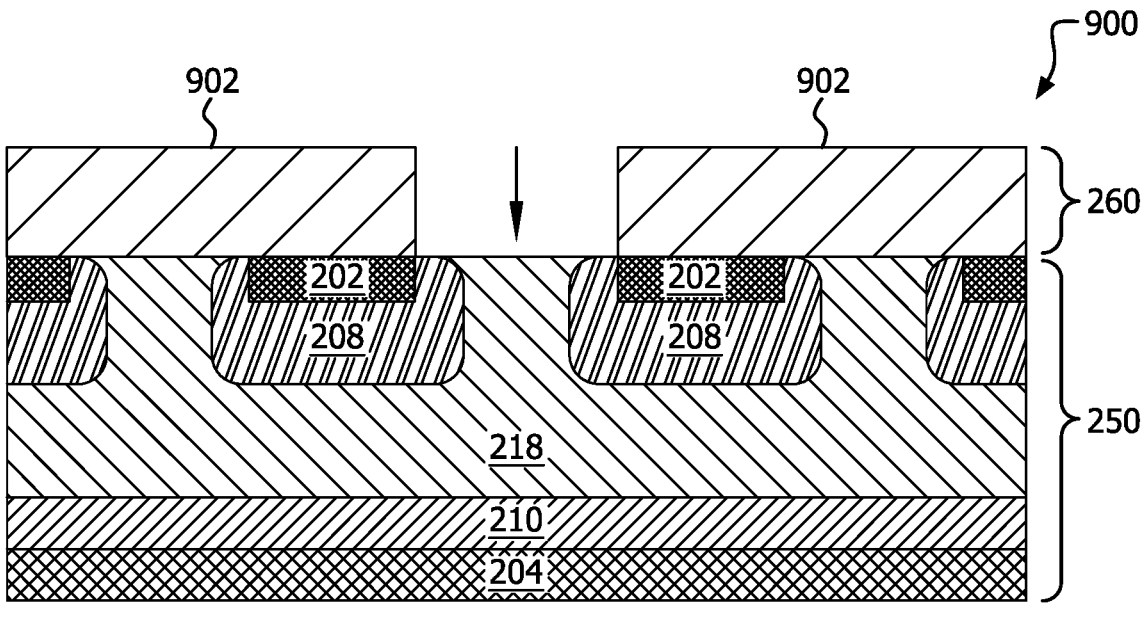
FIG. 9 is another cross-sectional view of an intermediate structure for manufacturing a power MOSFET.

FIG. 9 is a cross-sectional view of an intermediate structure 900 for manufacturing power MOSFET 200. Intermediate structure 900 includes wafer 250, drain region 204, n– region 210, n-epitaxial region 218, body regions 208, and source regions 202. A blocking material 902, such as a photoresist material, is deposited in region 260 on a top surface of wafer 250. Blocking material 902 is disposed on the top surface of wafer 250, in region 260, in such a way as to selectively prevent diffusion of doping materials into wafer 250.

P-type doping material is implanted into n-epitaxial region 218 between body regions 208 via gaps in the blocking material 902 as indicated by an arrow. In a preferred embodiment, the buffer layer implant overlaps (e.g., slightly) the body layers 208. In some implementations, the overlap of the buffer layer with the body regions has the advantage of improved breakdown voltage stability and/or reduced Qrr with increasing overlap. In some implementations, the buffer layer implant overlaps with the body region such that the overlap does not extend beyond the outer edge of the body regions (e.g., buffer layer 270 does not extend further right than right body region 208 with respect to FIG. 11, or further left than left body region 208 with respect to FIG. 11). In some implementations, this has the advantage of avoiding increasing the resistance of the MOSFET.

Figure 10:
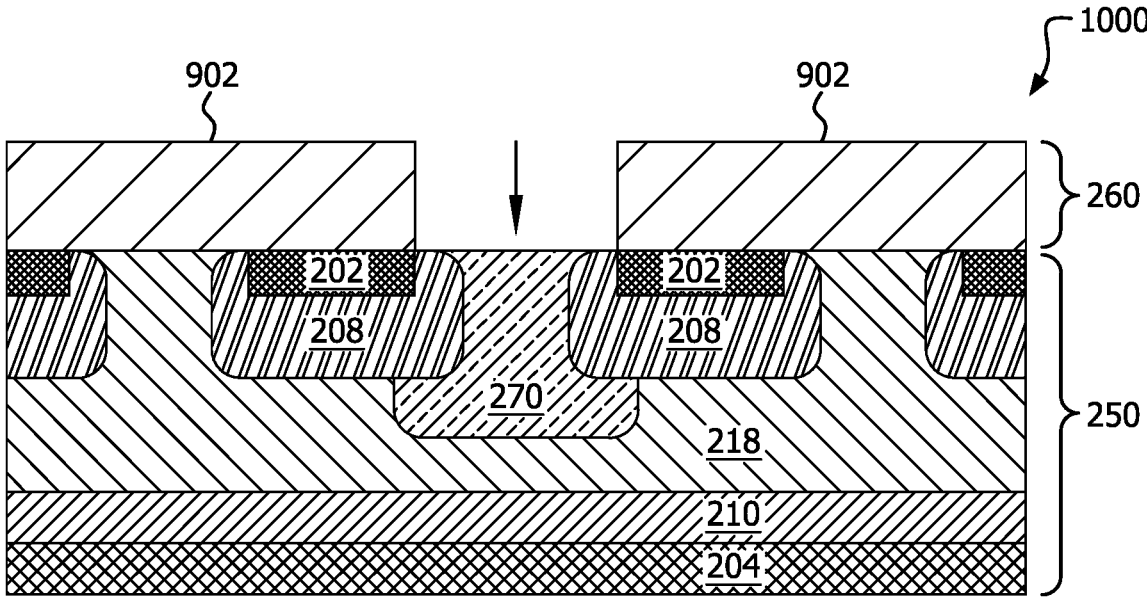
FIG. 10 is another cross-sectional view of an intermediate structure for manufacturing a power MOSFET.

FIG. 10 is a cross-sectional view of an intermediate structure 1000 for manufacturing power MOSFET 200. Intermediate structure 1000 includes wafer 250, drain region 204, n– region 210, n-epitaxial region 218, body regions 208, and source regions 202. Buffer region 270 is shown as formed by the implantation of p-type doping material described with respect to FIG. 9. Buffer region 270 has a lower p-type doping concentration than body regions 208, and is deeper than body regions 208, e.g., preferably by at least 30%. In some implementations, this has the advantage of reducing the injection efficiency of the body. Buffer region 270 is shown and described in further detail with respect to FIGS. 15 and 16. In some implementations, the light doping of buffer region 270 is contrary to known regions associated with or deeper than the body, which are typically as heavily doped as possible to prevent false triggering of the parasitic transistor and/or to enhance injection efficiency of the body region into the epitaxial layer. Contrary to the state of the art, the light doping of buffer region 270, in some implementations, has the advantage of reducing Qrr while mitigating these effects.

Blocking material 902 remains in place, and further p-type material is injected into buffer region 270 and body regions 208 via gaps in the blocking material 902 as indicated by an arrow.

Figure 11:
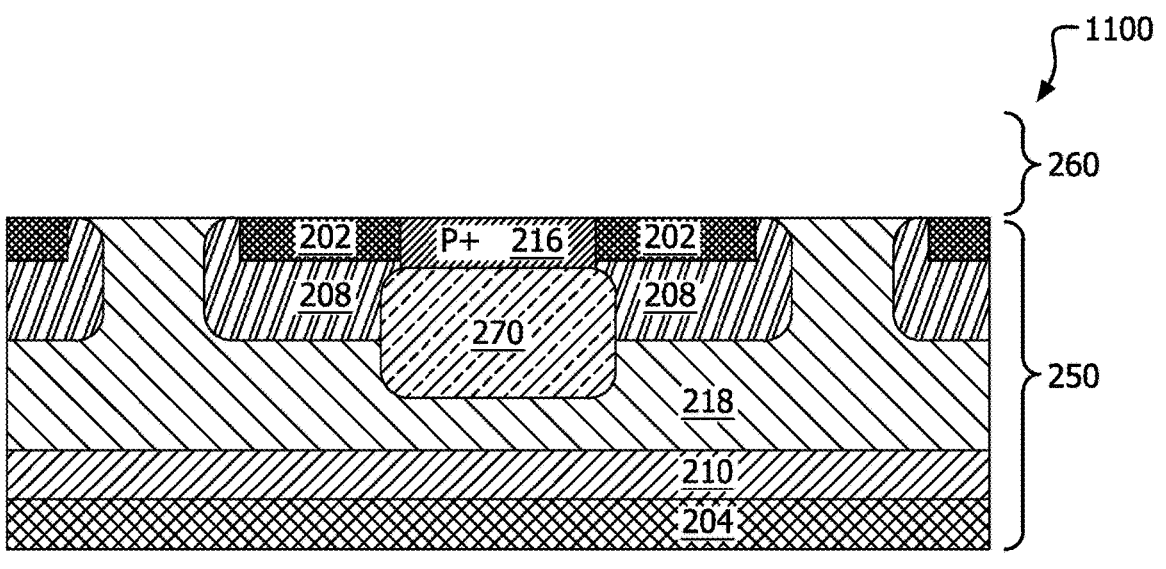
FIG. 11 is another cross-sectional view of an intermediate structure for manufacturing a power MOSFET.

FIG. 11 is a cross-sectional view of an intermediate structure 1100 for manufacturing power MOSFET 200. Intermediate structure 1000 includes wafer 250, drain region 204, n– region 210, n-epitaxial region 218, body regions 208, source regions 202, buffer region 270, and p+ region 216, which was formed by the injection of p-type doping material described with respect to FIG. 10. P+ region 216 has a higher p-type doping concentration than body regions 208, and higher p-type doping concentration than buffer 270, but is shallower than body regions 208 and buffer 270.

Intermediate structure 1100 is shown with blocking material 902 as removed, e.g., by a suitable solvent, after p+ region 216 is formed.

Figure 12:
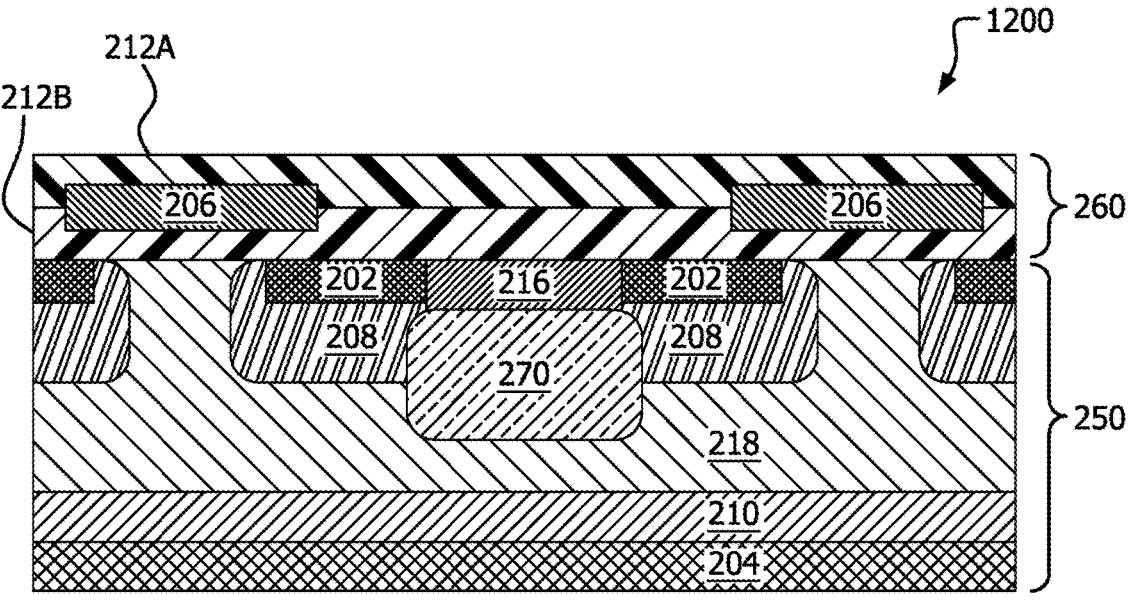
FIG. 12 is another cross-sectional view of an intermediate structure for manufacturing a power MOSFET.

FIG. 12 is a cross-sectional view of an intermediate structure 1200 for manufacturing power MOSFET 200.

Intermediate structure 1200 includes wafer 250, drain region 204, n– region 210, n-epitaxial region 218, body regions 208, source regions 202, buffer region 270, p+ region 216, and an oxide layer 212 forming the gate oxide grown thermally in a region 260 on a top surface of wafer 250. Any suitable oxide or other insulator is usable in other implementations. In this example, oxide layer 212 includes silicon dioxide (SiO2). In this example, oxide layer 212 is formed by first forming an oxide layer 212A. The gate 206 (preferably polysilicon material) is deposited on oxide layer 212A and etched to suitable dimensions. Oxide layer 212B is deposited on top of the gate 206 and oxide layer 212A to form oxide layer 212.

Figure 13:
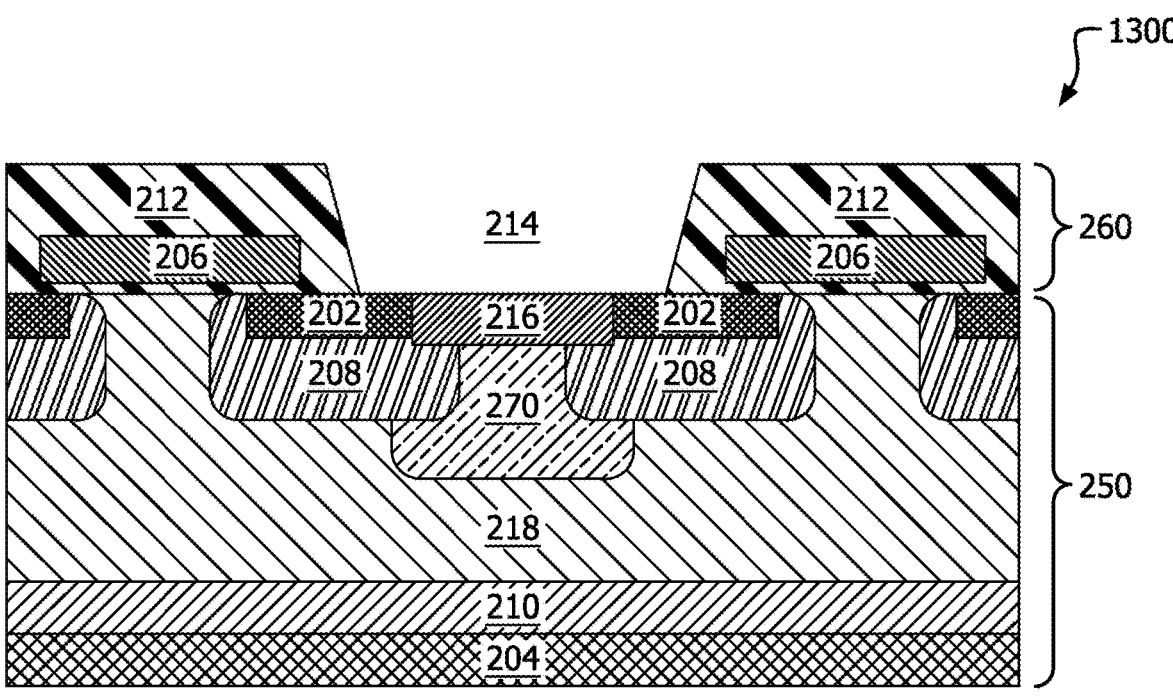
FIG. 13 is another cross-sectional view of an intermediate structure for manufacturing a power MOSFET.

FIG. 13 is a cross-sectional view of an intermediate structure 1300 for manufacturing power MOSFET 200. Intermediate structure 1300 includes wafer 250, drain region 204, n– region 210, n-epitaxial region 218, body regions 208, source regions 202, buffer region 270, p+ region 216, and oxide layer 212.

Oxide layer 212 is selectively removed from a portion of region 260 to expose p+ region 216 and source regions 202, e.g., by a mask and etch process or other suitable process. Source metal 214 is deposited in the resulting gap in oxide layer 212, on top of p+ region 216 and source regions 202. P+ region 216 and source regions 202 are shorted together by source metal 214. Source metal 214 is deposited by sputtering, vapor deposition, or any other suitable process.

Through masking and etching or other suitable processes, gate regions 206 are grown on top of a field oxide portion of oxide 212, and further oxide 212 is grown on top of gate region 206. Gate region 206 is formed from polysilicon material, or any other suitable material.

Figure 14:
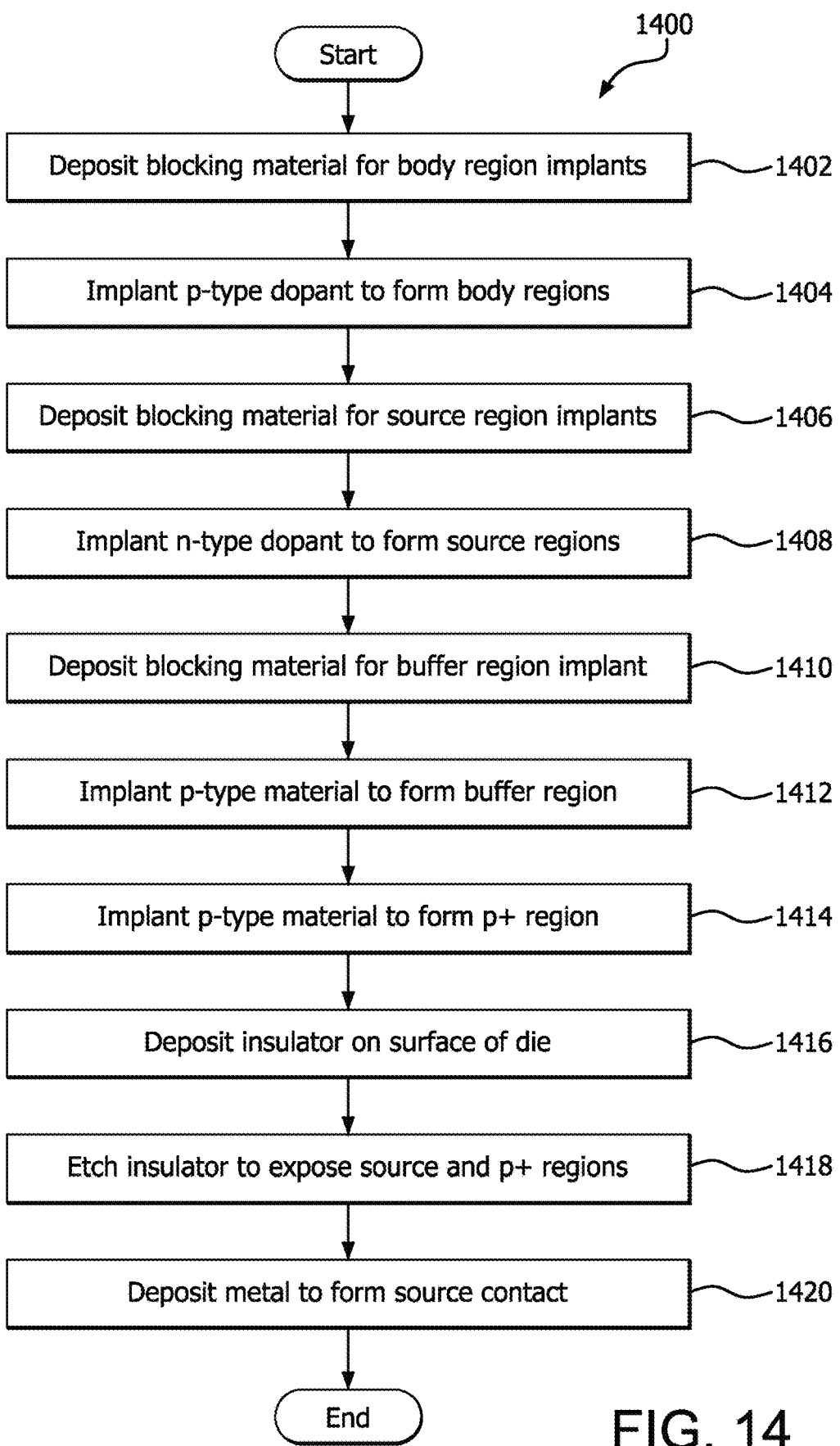
FIG. 14 is a flow chart which illustrates a method for manufacturing a power MOSFET.

FIG. 14 is a flow chart which illustrates a method 1400 for manufacturing a power MOSFET, such as power MOSFET 200 shown and described with respect to FIG. 2, in the manner described with respect to FIGS. 5-13. It is noted that some implementations omit certain steps, reorder steps, and/or include additional steps.

In step 1402 a blocking material is deposited on a surface of an intermediate structure and patterned to expose areas of the die for implantation of p-type dopant to form body regions in the die, for manufacturing a power MOSFET.

In some implementations, the intermediate structure includes a wafer 250, drain region 204, n– region 210, and n-epitaxial region 218, as shown and described with respect to FIG. 5, and the blocking material is deposited on the top surface of wafer 250, in region 260, in such a way as to selectively prevent diffusion of doping materials into wafer 250, as shown and described with respect to FIG. 5.

In a preferred embodiment, the blocking material includes silicon dioxide, which is patterned and etched using a photoresist process. The photoresist is removed and the oxide layer remains as a Hard Mask (HM). In some implementations, this has the advantage of defining a self-aligned region relative to this layer by adding another oxide deposition and doing a so-called "spacer etch" (commonly known in the field) thus giving the ability to self-align two independent implant layers.

In step 1404, p-type material is implanted in the exposed areas of the intermediate structure to form body regions in the die. After the body regions are formed in the intermediate structure, the blocking material (HM) is not removed.

In some implementations, the intermediate structure includes wafer 250, drain region 204, n– region 210, n-epitaxial region 218, and blocking material 502, as shown and described with respect to FIG. 6. P-type doping material is injected into n-epitaxial region 218 via gaps in the blocking material 502 as indicated by arrows in FIG. 6. The injected p-type doping material forms body regions 208 in intermediate structure 600 as shown. It is noted that other body regions are shown formed in wafer 250. Such regions form a part of other devices in the wafer, in some implementations.

In step 1406 a blocking material, preferably silicon dioxide, is deposited on top of the original HM defined in step 1404 the surface of the intermediate structure and patterned by a spacer etch process, which in some implementations is a "dry" or plasma type etch, to expose areas of the die for implantation of n-type dopant to form source regions in the die. In some implementations, this has the advantage of aligning the n-source to the body region to precisely control the channel length of the MOSFET.

In some implementations, the intermediate structure includes wafer 250, drain region 204, n– region 210, n-epitaxial region 218, and body regions 208, and the blocking material, such as an oxide material, is deposited in region 260 on a top surface of wafer 250, as shown and described with respect to FIG. 7. The blocking material is disposed on the top surface of wafer 250 and on top of the HM of step 1404, in region 260, in such a way as to selectively prevent diffusion of doping materials into wafer 250.

In step 1408, n-type material is implanted in the exposed areas of the intermediate structure to form source regions in the die. After the source regions are formed in the intermediate structure, the blocking material is removed, e.g., by a suitable solvent.

In some implementations, the intermediate structure includes wafer 250, drain region 204, n– region 210, n-epitaxial region 218, body regions 208, and blocking material 702 as shown and described with respect to FIG. 8. The n-type doping material is injected into body regions 208 via gaps in the blocking material 702 as indicated by arrows in FIG. 8. The injected n-type doping material forms source regions 202 in intermediate structure as shown in FIG. 8. It is noted that other source regions are shown formed in wafer 250. Such regions form a part of other devices in the wafer, in some implementations.

In step 1410, blocking material is deposited on the surface of the intermediate structure and patterned to expose areas of the die for implantation of p-type dopant to form a buffer region in the die. In some implementations, the intermediate structure includes wafer 250, drain region 204, n– region 210, n-epitaxial region 218, body regions 208, and source regions 202 as shown and described with respect to FIG. 9. The blocking material, such as a photoresist material, is deposited in region 260 on a top surface of wafer 250. The blocking material is disposed on the top surface of wafer 250, in region 260, in such a way as to selectively prevent diffusion of doping materials into wafer 250.

In step 1412, p-type doping material is implanted in the exposed areas of the intermediate structure to form the buffer region in the die. In some implementations, the p-type doping material is implanted into n-epitaxial region 218 between body regions 208 via gaps in the blocking material 902 as indicated by an arrow, as shown and described with respect to FIG. 10.

In step 1414, further p-type material is implanted in the exposed areas of the intermediate structure to form a p+ region in the die, and the blocking material is removed, e.g., using a suitable solvent. In some implementations, the further p-type material is injected into buffer region 270 and body regions 208 via gaps in the blocking material 902 as indicated by an arrow as shown and described with respect to FIG. 10 to yield the intermediate structure as shown and described with respect to FIG. 11.

In step 1416, an insulator is thermally grown at high temperatures or deposited on the surface of the intermediate structure. Any suitable oxide or other insulator is usable in some implementations. In this example, the insulator includes silicon dioxide (SiO2). In some implementations, the intermediate structure includes wafer 250, drain region 204, n− region 210, n-epitaxial region 218, body regions 208, source regions 202, buffer region 270, p+ region 216, and the insulator is an oxide layer 212 grown in a region 260 on a top surface of wafer 250 as shown and described with respect to FIG. 12. After the thermal or deposited oxide, a polysilicon layer is defined and patterned to form the gate of the MOSFET.

In step 1418, the insulator is patterned and etched to expose the source regions and p+ region, and in step 1420, metal is deposited on the exposed source regions and p+ region to form a source contact and to short the source regions and p+ region together. Gate regions are formed above the thermally grown or deposited insulator by etching a deposited polysilicon layer to form the gate of the MOSFET. In some implementations, the intermediate structure includes wafer 250, drain region 204, n− region 210, n-epitaxial region 218, body regions 208, source regions 202, buffer region 270, p+ region 216, and oxide layer 212 as shown and described with respect to FIG. 13. The insulator (e.g., as oxide layer 212) is selectively removed from a portion of region 260 to expose p+ region 216 and source regions 202, e.g., by a mask and etch process or other suitable process. Source metal 214 is deposited in the resulting gap in oxide layer 212, on top of p+ region 216 and source regions 202. P+ region 216 and source regions 202 are shorted together by source metal 214. Source metal 214 is deposited by sputtering, vapor deposition, or any other suitable process. Through masking and etching or other suitable processes, gate regions 206 are grown on top of a field oxide portion of oxide 212, and further oxide 212 is grown on top of gate region 206. Gate region 206 is formed from polysilicon material, or any other suitable material.

Figure 15:
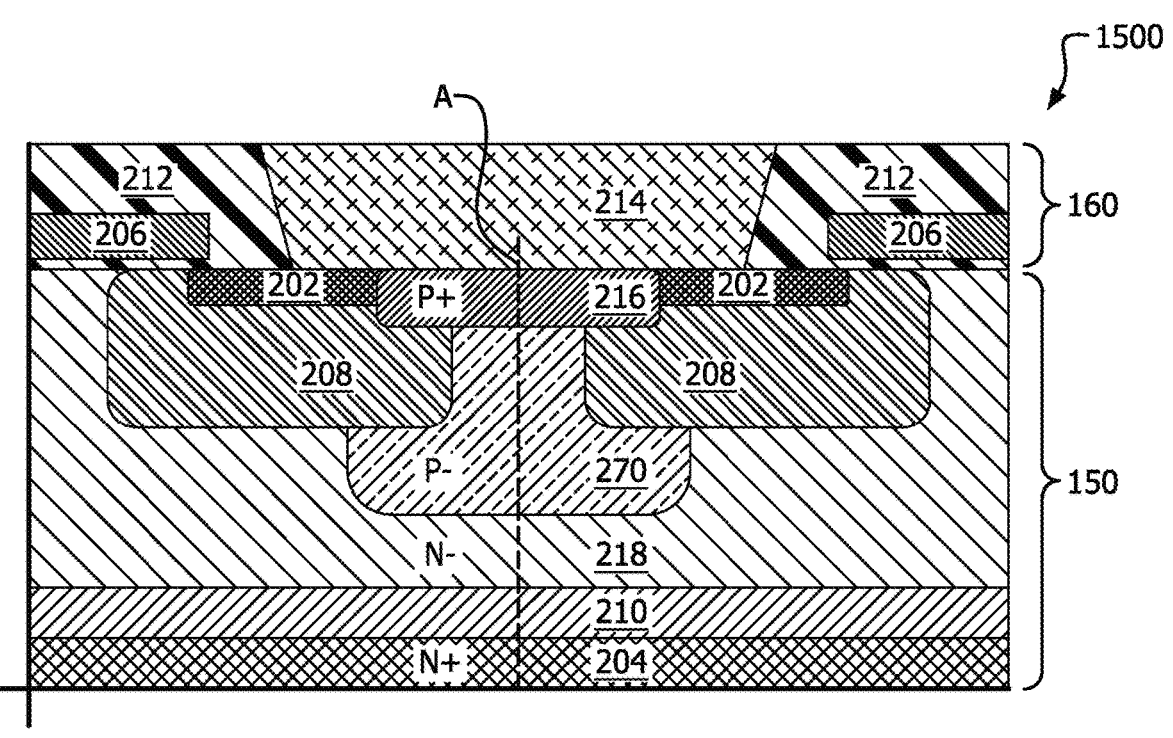
FIG. 15 is a cross-sectional view of the example power MOSFET of FIG. 2, labeled with an axis A.

FIG. 15 is a cross-sectional view of example power MOSFET 200, as shown and described with respect to FIG. 2, labeled with an axis A and relative doping types and concentrations for layers 216, 270, 218, 210, 204. Axis A passes through layers 216, 270, 218, 210, 204, respectively.

Figure 16:
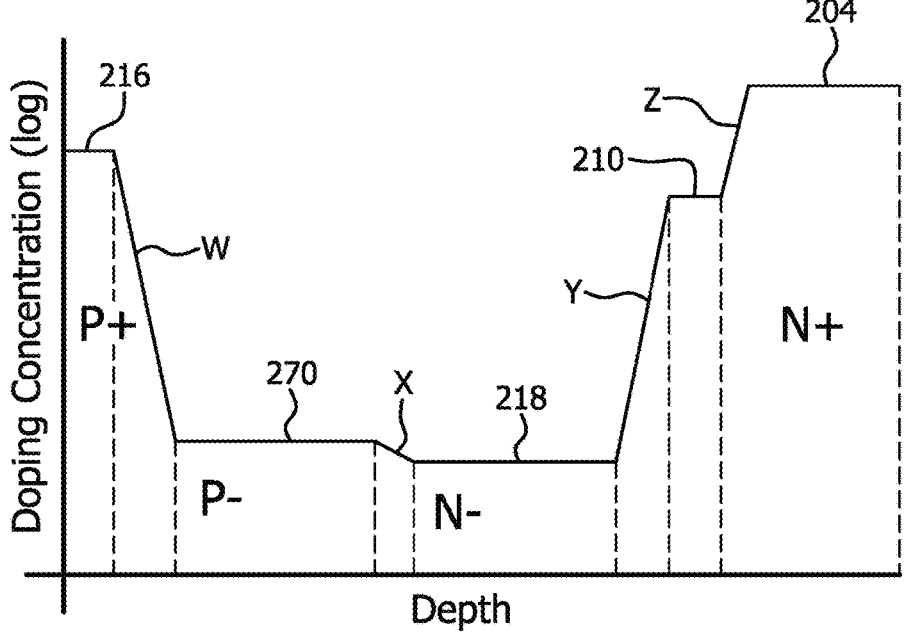
FIG. 16 is a line graph illustrating relative doping concentrations in the example power MOSFET of FIG. 2.

FIG. 16 is a line graph illustrating relative doping concentrations in the regions of MOSFET 200 along axis A of FIG. 15. The line graph illustrates the relative doping concentration (on a logarithmic scale) of regions 216, 270, 218, 210, 204, respectively. Between each region along the axis are transition regions where the doping concentration gradually changes. For example, segment W of the line graph illustrates the transition region between regions 216 and 270. Segment X of the line graph illustrates the transition region between regions 270 and 218. Segment Y of the line graph illustrates the transition region between regions 218 and 210. Segment Z of the line graph illustrates the transition region between regions 210 and 204. It is noted that the transition in doping concentration between the buffer region 270 and epitaxial region 218, illustrated by segment X, is relatively minimal.

The minimal transition, illustrated by segment X, causes the reverse recovery charge ($Q_{RR}$) in power MOSFET 200 to be relatively lower than in power MOSFETs that do not share this feature. Accordingly, the reverse recovery time ($t_{RR}$) is also relatively lower in power MOSFET 200. This can have the advantage of increasing the switching speed of power MOSFET 200.

Figure 17:
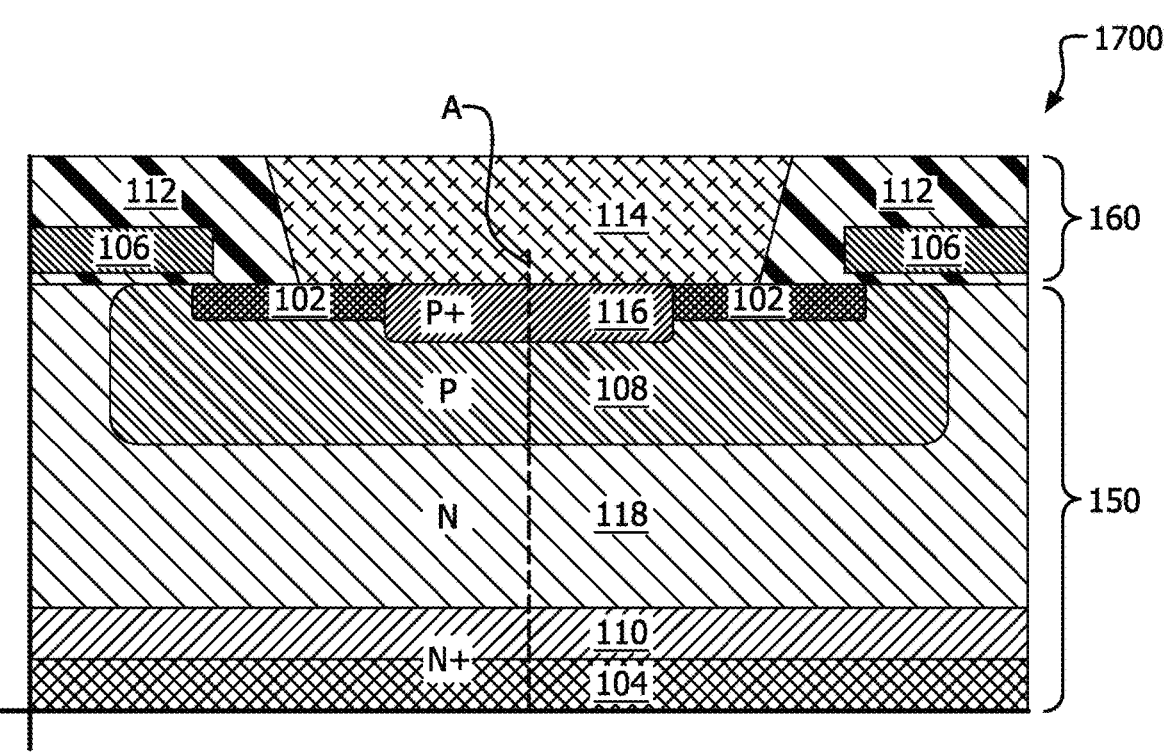
FIG. 17 is a cross-sectional view of the example power MOSFET of FIG. 1, labeled with an axis A.
Figure 18:
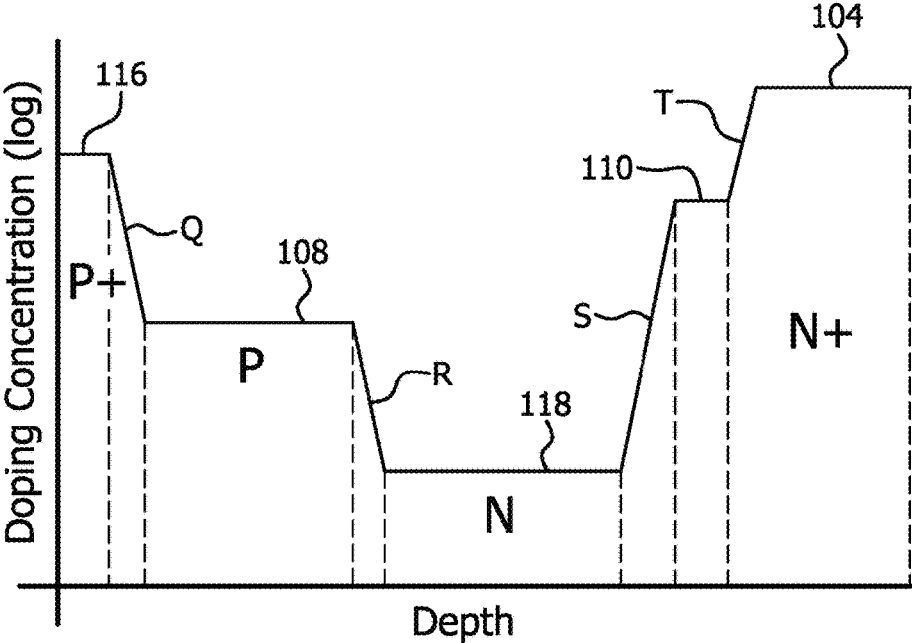
FIG. 18 is a line graph illustrating relative doping concentrations in the example power MOSFET of FIG. 1.

For comparison, FIG. 18 is a line graph illustrating relative doping concentrations in the regions of MOSFET 100 along axis A of FIG. 17. The line graph illustrates the relative doping concentration (on a logarithmic scale) of regions 116, 108, 118, 110, 104, respectively.

Between each region along the axis are transition regions where the doping concentration gradually changes. For example, segment Q of the line graph illustrates the transition region between regions 116 and 108. Segment R of the line graph illustrates the transition region between regions 108 and 118. Segment S of the line graph illustrates the transition region between regions 118 and 110. Segment T of the line graph illustrates the transition region between regions 110 and 104. It is noted that the transition in doping concentration between the body region 108 and epitaxial region 118, illustrated by segment R, is relatively great as compared with segment X, as shown and described with respect to FIGS. 15 and 16.

The relatively greater transition, illustrated by segment R, causes the reverse recovery charge ($Q_{RR}$) is in power MOSFET 100 to be relatively greater than in power MOSFET 200. Accordingly, the reverse recovery time ($t_{RR}$) is also relatively greater in power MOSFET 100. Thus, in some implementations, power MOSFET 100 has a slower switching speed than power MOSFET 200.

It should be understood that many variations are possible based on the disclosure herein. Although features and elements are described above in particular combinations, each feature or element can be used alone without the other features and elements or in various combinations with or without other features and elements.

What is claimed is:

1. A metal oxide silicon field effect transistor (MOSFET), comprising:
   two source regions;
   a drain region;
   two body regions, each of the two body regions contacting a different one of the two source regions;
   a buffer region disposed between and contacting the two body regions, the buffer region comprising a region of a same dopant type material as the two body regions which extends from one of the two body regions to the other of the two body regions; and
   a region of material disposed between and contacting the buffer region and a least one of the two source regions;
   wherein a doping concentration of the buffer region is less than a doping concentration of the two body regions;
   wherein the buffer region extends further into an epitaxial layer than each of the two body regions; and
   wherein a doping concentration of the region of material disposed between and contacting the buffer region and the at least one of the two source regions is greater than a doping concentration of the two body regions.

2. The MOSFET of claim 1, wherein the two body regions comprise a p-type material, and the buffer region comprises another p-type material doped to a lower concentration than the p-type material of the two body regions.

3. The MOSFET of claim 1, wherein a body diode of the MOSFET includes the buffer region.

4. The MOSFET of claim 1, a body diode of the MOSFET includes a P-N junction between the buffer region and an epitaxial layer of the MOSFET.

5. The MOSFET of claim 1, wherein a P-N junction between the buffer region and an epitaxial layer of the MOSFET forms a depletion layer when the two source regions and the drain region are reverse biased.

6. The MOSFET of claim 1, wherein a reverse recovery charge in a P-N junction between the buffer region and an epitaxial layer of the MOSFET recombines to form a depletion layer when the two source regions and the drain region are reverse biased.

7. A method for manufacturing a metal oxide silicon field effect transistor (MOSFET), the method comprising:

implanting a doping material in a die between two body regions to form a buffer region disposed between the two body regions, the buffer region comprising a region of a same dopant type material as the two body regions which extends from one of the two body regions to the other of the two body regions; and implanting a region of material disposed between and contacting the buffer region and a source region;

wherein a doping concentration of the buffer region is less than a doping concentration of the two body regions;

wherein the buffer region extends further into an epitaxial layer than the two body regions; and wherein a doping concentration of the region of material disposed between and contacting the buffer region and the source region is greater than a doping concentration of the two body regions.

8. The method of claim 7, wherein the two body regions comprise a p-type material, and the buffer region comprises another p-type material doped to a lower concentration than the p-type material of the two body regions.

9. The method of claim 7, wherein the buffer region comprises a portion of a body diode of the MOSFET.

10. The method of claim 7, wherein the buffer region comprises a portion of a body diode of a MOSFET that includes a P-N junction between the buffer region and an epitaxial layer of the MOSFET.

11. The method of claim 7, wherein a P-N junction between the buffer region and an epitaxial layer of the MOSFET forms a depletion layer when the source region and a drain region of the MOSFET are reverse biased.

12. The method of claim 7, wherein a reverse recovery charge in a P-N junction between the buffer region and an epitaxial layer of the MOSFET recombines to form a depletion layer when the source region and a drain region of the MOSFET are reverse biased.

13. A semiconductor device comprising:

a source; and a drain;

wherein a diode of the semiconductor device, disposed between the source and the drain, comprises a buffer region disposed between two body regions and comprising a region of a same dopant type material as the two body regions which extends from one of the two body regions to the other of the two body regions, at least one of the two body regions contacting the source;

wherein a doping concentration of the buffer region is less than a doping concentration of the two body regions;

wherein the buffer region extends further into an epitaxial layer than the two body regions; and wherein a doping concentration of a region of material disposed between and contacting the buffer region and the source is greater than a doping concentration of the two body regions.

14. The semiconductor device of claim 13, wherein the body regions comprise p-type material doped to a first dopant concentration, and the buffer region comprises p-type material doped to a second dopant concentration that is lower than the first dopant concentration.

15. The semiconductor device of claim 13, wherein the diode comprises an intrinsic diode of a metal oxide semiconductor field effect transistor (MOSFET).

16. The semiconductor device of claim 13, wherein the diode includes a P-N junction between the buffer region and an epitaxial region.

17. The semiconductor device of claim 13, wherein a P-N junction between the buffer region and an epitaxial region forms a depletion layer when the source and the drain are reverse biased.

\* \* \* \* \*